(12) United States Patent
Chen et al.

(10) Patent No.: US 9,305,949 B2
(45) Date of Patent: Apr. 5, 2016

(54) BIG-SMALL PIXEL SCHEME FOR IMAGE SENSORS

(71) Applicant: OmniVision Technologies, Inc., Santa Clara, CA (US)

(72) Inventors: Gang Chen, San Jose, CA (US); Duli Mao, Sunnyvale, CA (US); Dajiang Yang, San Jose, CA (US); Zhibin Xiong, Santa Clara, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 165 days.

(21) Appl. No.: 14/070,286

(22) Filed: Nov. 1, 2013

(65) Prior Publication Data

US 2015/0123172 A1    May 7, 2015

(51) Int. Cl.
*H01L 27/148* (2006.01)
*H01L 27/146* (2006.01)

(52) U.S. Cl.
CPC .... *H01L 27/14614* (2013.01); *H01L 27/14641* (2013.01); *H01L 27/14645* (2013.01); *H01L 27/14621* (2013.01)

(58) Field of Classification Search
CPC ............ H01L 27/14812; H01L 27/14887; H01L 27/1463; H01L 27/14689; H01L 27/14609
USPC ........................................ 257/223, 230, 292
See application file for complete search history.

(56) References Cited

U.S. PATENT DOCUMENTS

| | | | |
|---|---|---|---|
| 7,525,077 B2 * | 4/2009 | Kim et al. | 250/208.1 |
| 7,863,647 B1 | 1/2011 | Veliadis | |
| 2004/0207734 A1 | 10/2004 | Horiuchi | |
| 2006/0118837 A1 | 6/2006 | Choi | |
| 2007/0141801 A1 * | 6/2007 | Kwon et al. | 438/400 |
| 2009/0002528 A1 | 1/2009 | Manabe et al. | |
| 2009/0200580 A1 | 8/2009 | Rhodes et al. | |
| 2010/0102206 A1 | 4/2010 | Cazaux et al. | |
| 2010/0277607 A1 | 11/2010 | Choi et al. | |
| 2010/0277623 A1 | 11/2010 | Tejada et al. | |
| 2010/0309333 A1 | 12/2010 | Smith et al. | |
| 2013/0076910 A1 | 3/2013 | Scott | |
| 2013/0242147 A1 | 9/2013 | Lee | |
| 2013/0258098 A1 | 10/2013 | Ikemoto | |
| 2014/0239154 A1 * | 8/2014 | Chen et al. | 250/208.1 |
| 2014/0246561 A1 | 9/2014 | Chen et al. | |
| 2015/0179695 A1 | 6/2015 | Lyu et al. | |

* cited by examiner

*Primary Examiner* — Andy Huynh
(74) *Attorney, Agent, or Firm* — Blakely Sokoloff Taylor & Zafman LLP

(57) ABSTRACT

An image sensor pixel for use in a high dynamic range image sensor includes a first photodiode, a plurality of photodiodes, a shared floating diffusion region, a first transfer gate, and a second transfer gate. The first photodiode is disposed in a semiconductor material. The first photodiode has a first light exposure area and a first doping concentration. The plurality of photodiodes is also disposed in the semiconductor material. Each photodiode in the plurality of photodiodes has the first light exposure area and the first doping concentration. The first transfer gate is coupled to transfer first image charge from the first photodiode to the shared floating diffusion region. The second transfer gate is coupled to transfer distributed image charge from each photodiode in the plurality of photodiodes to the shared floating diffusion region.

21 Claims, 5 Drawing Sheets

BIG-SMALL PIXEL SCHEME FOR IMAGE SENSORS

TECHNICAL FIELD

This disclosure relates generally to optics, and in particular but not exclusively, relates to high dynamic range image sensors.

BACKGROUND INFORMATION

High dynamic range ("HDR") image sensors are useful for many applications. In general, ordinary image sensors, including for example charge coupled device ("CCD") and complementary metal oxide semiconductor ("CMOS") image sensors, have a dynamic range of approximately 70 dB dynamic range. In comparison, the human eye has a dynamic range of up to approximately 100 dB. There are a variety of situation in which an image sensor having an increased dynamic range is beneficial. For example, image sensors having a dynamic range of more than 100 dB are needed in the automotive industry in order to handle different driving conditions, such as driving from a dark tunnel into bright sunlight. Indeed, many applications may require image sensors with at least 90 dB of dynamic range or more to accommodate a wide range of lighting situations, varying from low light conditions to bright light conditions.

One known approach for implementing HDR image sensors is to use a combination of a photodiodes in each pixel. One of the photodiodes can be used to sense bright light conditions while another photodiode can be used to sense low light conditions. In this approach, the photodiode used to sense bright light is typically smaller (having a smaller light exposure area) than the photodiode used to sense low light conditions. However, this approach requires an asymmetric layout that tends to increase costs. In addition to increasing cost, asymmetric fabrication of the photodiodes in each pixel includes optical asymmetry that may introduce image light ray angle separation. Image light ray angle separation can cause asymmetric blooming, crosstalk, and other undesirable effects, especially when the image light is angled relative to the face of the image sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
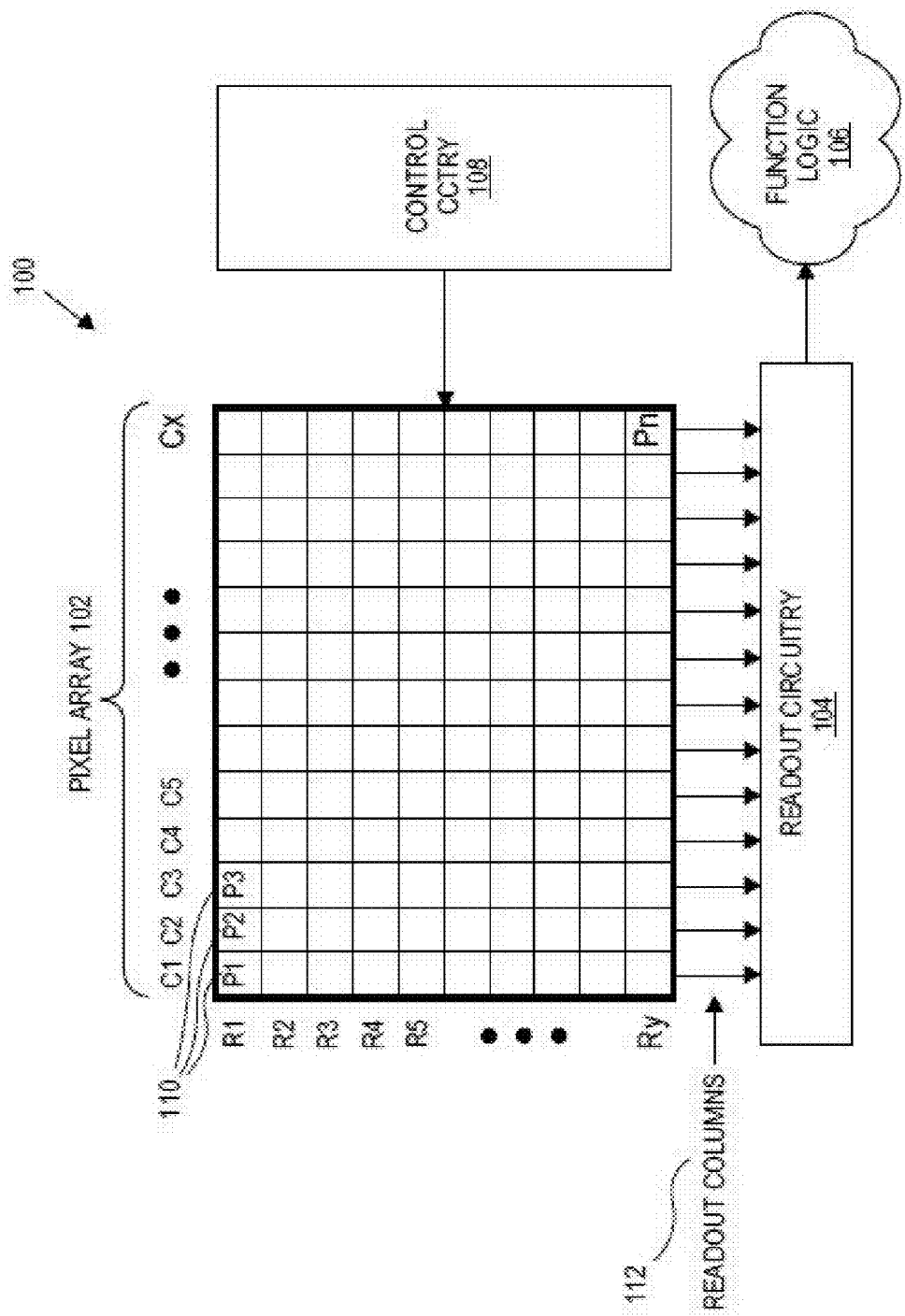
FIG. 1 is a block diagram schematic illustrating one example of an HDR imaging system, in accordance with an embodiment of the disclosure.

FIG. 1 is a block diagram schematic illustrating one example of an HDR imaging system 100, in accordance with an embodiment of the disclosure. HDR imaging system 100 includes an example pixel array 102, control circuitry 108, readout circuitry 104, and function logic 106. As shown in the depicted example, HDR imaging system 100 includes pixel array 102 which is coupled to control circuitry 108 and readout circuitry 104. Readout circuitry 104 is coupled to function logic 106. Control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

In one example, pixel array 102 is a two-dimensional (2D) array of imaging sensors or pixels 110 (e.g., pixels P1, P2 . . . , Pn). In one example, each pixel 110 is a CMOS imaging pixel including at least a large sub-pixel and a small sub-pixel. The large sub-pixels and the small sub-pixels in the pixel array may receive separate shutter signals. As illustrated, each pixel 110 is arranged into a row (e.g., rows R1 to Ry) and a column (e.g., column C1 to Cx) to acquire image data of a person, place, object, etc., which can then be used to render an image of the person, place, object, etc.

In one example, after each pixel 110 has acquired its image data or image charge, the image data is read out by readout circuitry 104 through readout columns 112 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously. The image charge generated by the large sub-pixel and the small sub-pixel may be read out separately during different time periods.

Figure 2:
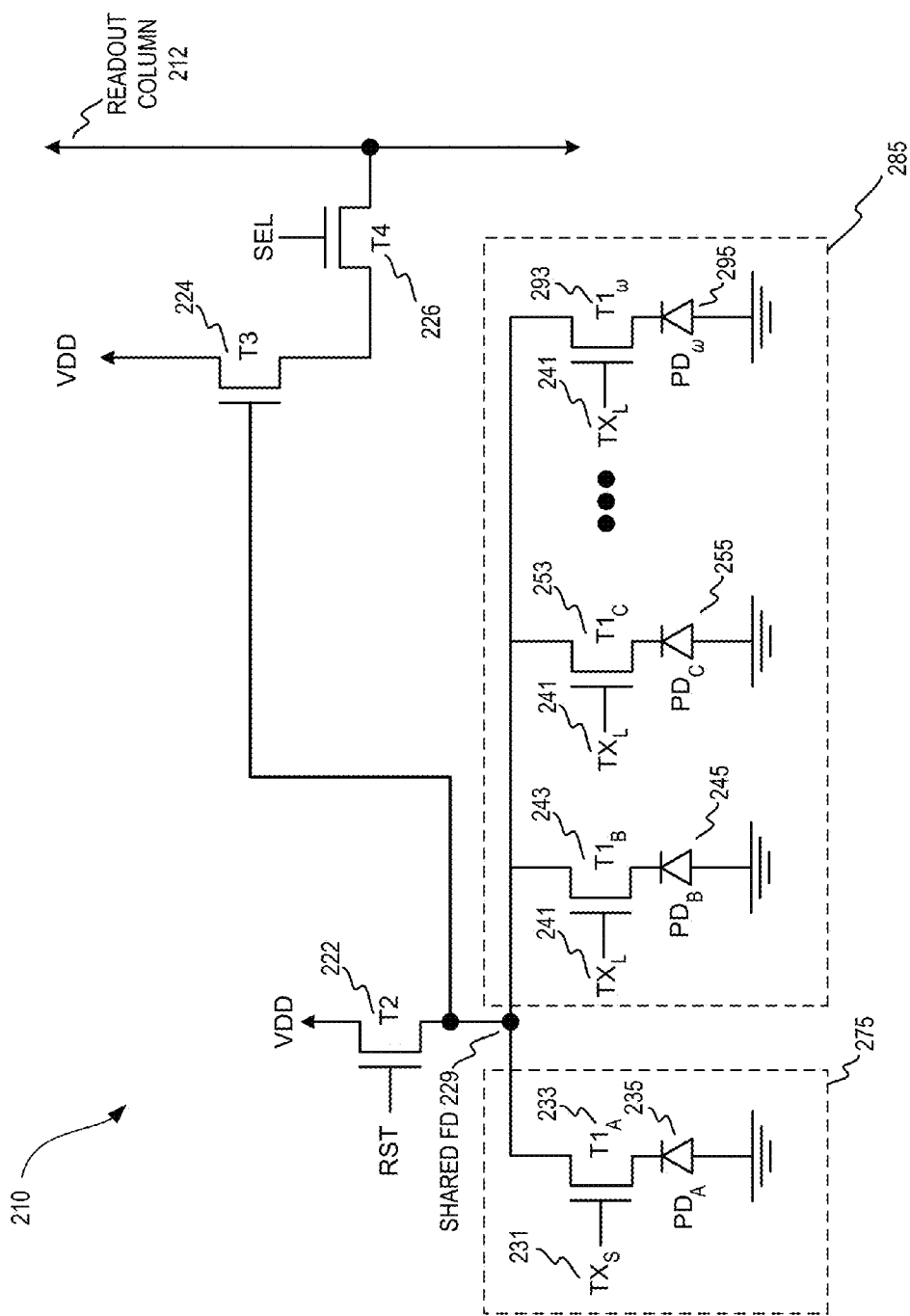
FIG. 2 is a schematic illustrating one example of an HDR pixel that can be implemented in the HDR image sensor illustrated in FIG. 1, in accordance with an embodiment of the disclosure.

FIG. 2 is a schematic illustrating one example of an HDR pixel 210 that can be implemented as pixel(s) 110 in HDR imaging system 100, in accordance with an embodiment of the disclosure. Pixel 210 includes a small sub-pixel 275 and a large sub-pixel 285. Small sub-pixel 275 includes a transfer transistor 233 ($T1_A$) and a first photodiode 235 ($PD_A$) disposed in a semiconductor material (e.g. silicon). Transfer transistor 233 is coupled between shared floating diffusion region 229 and first photodiode 235. Large sub-pixel 285 includes a plurality of photodiodes that includes photodiodes 245 ($PD_B$), 255 ($PD_C$) . . . and 295 ($PD_\omega$), where ω represents the number of photodiodes in large sub-pixel 285. Large sub-pixel 285 also includes transfer transistors 243 ($T1_B$), 253 ($T1_C$) . . . and 293 ($T1_\omega$), where ω still represents the number of photodiodes and corresponding transfer transistors in large sub-pixel 285. Transfer transistors 243 ($T1_B$), 253 ($T1_C$) . . . and 293 ($T1_\omega$) are coupled between their respective photodiodes 245 ($PD_B$), 255 ($PD_C$) . . . and 295 ($PD_\omega$) and shared floating diffusion region 229.

Image light incident on pixel 210 will generate image charge in each of the photodiodes $PD_A$ through $PD_\omega$. First image charge is generated in first photodiode 235 $PD_A$. When transfer transistor 233 $T1_A$ receives a first transfer signal $TX_S$ 231 at its transfer gate, the first image charge is transferred to shared floating diffusion region 229. Photodiodes $PD_B$ through $PD_\omega$ in large sub-pixel 285 will also generate image charge in response to incident image light. Collectively, the image charge generated by the photodiodes in large sub-pixel 285 will be referred to as "distributed image charge" as it is distributed among the photodiodes, at least initially. When transfer transistors $T1_B$-$T1_\omega$ receive second transfer signal $TX_L$ 241 at their transfer gates, the distributed image charge from each photodiode in the plurality of photodiodes in large sub-pixel 285 is transferred to shared floating diffusion region 229. As FIG. 2 illustrates, transfer transistors $T1_B$-$T1_\omega$ all receive a common transfer signal ($TX_L$ 241). In one embodiment (not illustrated), the transfer transistors $T1_B$-$T1_\omega$ share a physically consolidated transfer gate which reduces the need for trace routing. Even in the illustrated embodiment, because they are electrically connected to receive a common transfer signal $TX_L$ 241, the transfer gates of the transfer transistors $T1_B$-$T1_\omega$ may be described as one transfer transistor having sub-gates coupled between shared floating diffusion region 229 and each photodiode $PD_B$ through $PD_\omega$.

The first image charge that accumulates in first photodiode $PD_A$ is switched through transfer transistor $T1_A$ 233 into shared floating diffusion region 229 in response to a control signal $TX_S$ being received on a first transfer gate of transfer transistor $T1_A$ 233. The distributed image charge that accumulates in the plurality of photodiodes $PD_B$ through $PD_\omega$ is switched through a second transfer transistor (which may include transfer gates of transfer transistors $T1_B$-$T1_\omega$ coupled together) into shared floating diffusion region 229 in response to control signal $TX_L$ being received on the second transfer gate of the second transfer transistor. It is understood that shared floating diffusion region 229 may be a physical combination of the drains of transfer transistors $T1_A$-$T1_\omega$.

As shown in the example, pixel 210 also includes an amplifier transistor T3 224 that has a gate terminal coupled to shared floating diffusion region 229. Thus, in the illustrated example, the image charge from small sub-pixel 275 and large sub-pixel 285 are separately switched to shared floating diffusion region 229, respectively, which shares the same amplifier transistor T3 224. In one example, amplifier transistor T3 224 is coupled in a source follower configuration as shown, which therefore amplifies an input signal at the gate terminal of amplifier transistor T3 224 to an output signal at the source terminal of amplifier transistor T3 224. As shown, row select transistor T4 226 is coupled to the source terminal of amplifier transistor T3 224 to selectively switch the output of amplifier transistor T3 224 to readout column 212 in response to a control signal SEL. As shown in the example, pixel 210 also includes reset transistor T2 222 coupled to shared floating diffusion region 229, which may be used to reset charge accumulated in pixel 210 in response to a reset signal RST. In one example, the charge accumulated in shared floating diffusion region 229 can be reset during an initialization period of pixel 210, or for example each time after charge information has been read out from pixel 210 and prior to accumulating charge in small sub-pixel 275 and large sub-pixel 285 for the acquisition of a new HDR image in accordance with the embodiments of the disclosure.

In one embodiment, each photodiode $PD_B$ through $PD_\omega$ is substantially identical to the first photodiode $PD_A$ 235. For example, each photodiode $PD_B$ through $PD_\omega$ may have the same charge capacity and other electrical characteristics as $PD_A$. This may reduce or eliminate the need to compensate for physical differences that impact the electrical function of the photodiodes. For example, some HDR pixel configurations include a single physically larger photodiode as a large sub-pixel. However, these singular physically larger photodiodes serving as a large sub-pixel often suffer higher lag, which can negatively influence the image charge transferred and the timing of the transfer. Furthermore, a singular physically larger photodiode as the large sub-pixel also introduces optical asymmetry that can introduce undesirable artifacts. In contrast, the photodiodes in large sub-pixel 285 being substantially identical to first photodiode $PD_A$ 235, allows image charge to transfer out of each photodiode $PD_B$ through $PD_\omega$ with essentially the same electrical characteristics as $PD_A$ 235, while still leveraging the increased semiconductor size for capturing image light by utilizing multiple photodiodes $PD_B$ through $PD_\omega$. These shared electrical characteristics may reduce lag time in the transfer of image charge from the large sub-pixel. The optical artifacts (e.g. crosstalk, ray angle separation) associated with the singular physically large photodiode are also mitigated as each photodiode in the plurality of photodiodes $PD_B$ through $PD_\omega$ are substantially identical.

Figure 3:
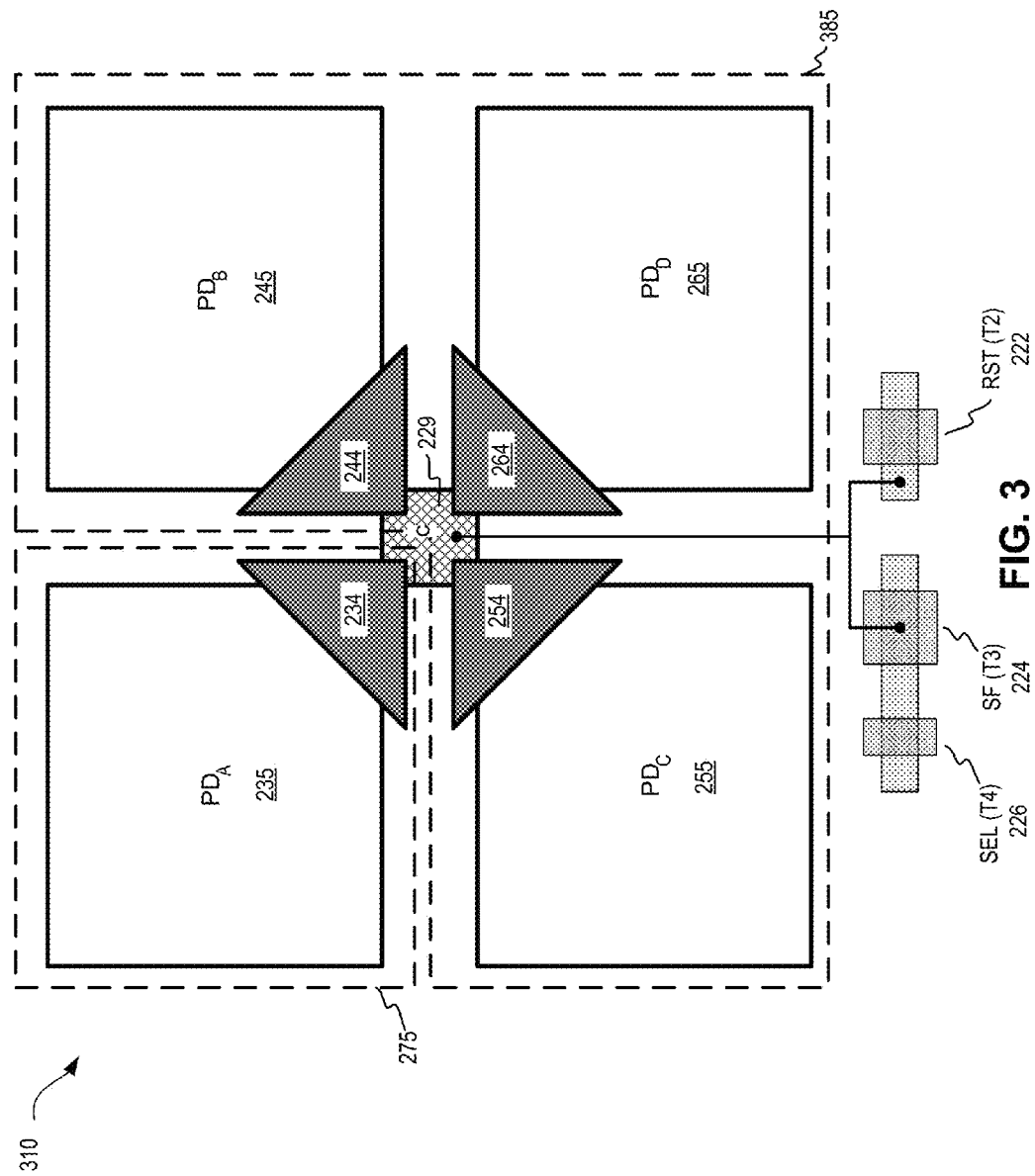
FIG. 3 is a plan view of one example of an image sensor pixel that includes a large sub-pixel and a small sub-pixel, in accordance with an embodiment of the disclosure.

FIG. 3 is a plan view of one example of an image sensor pixel 310 that includes a large sub-pixel 385 and a small sub-pixel 275, in accordance with an embodiment of the disclosure. The plan view illustrated in FIG. 3 is one example layout of image sensor pixel 210. Image sensor 310 includes three photodiodes $PD_B$ 245, $PD_C$ 255, and $PD_D$ 265 in large sub-pixel 385. The three photodiodes $PD_B$ 245, $PD_C$ 255, and $PD_D$ 265 and photodiode $PD_A$ 235 in small sub-pixel 275 are evenly spaced in a symmetrical pattern that is both vertically and horizontally symmetric.

FIG. 3 also illustrates transfer gates 234, 244, 254, and 264, which are the transfer gates of transfer transistors 233, 243, 253, and 263, respectively. In one embodiment (not illustrated), transfer gates 244, 254, and 264 are physically consolidated. Although the electrical connection is not illustrated in FIG. 3, transfer gates 244, 254, and 264 are all coupled to receive transfer signal $TX_L$ 241 and transfer gate 234 is coupled to receive transfer signal $TX_S$ 231. Each transfer gate is for transferring image charge from its respective photodiode to shared floating diffusion region 229. Shared floating diffusion region 229 is wired (via a trace) to the gate terminal of amplifier transistor T3 224, which may be coupled as a source follower ("SF"). Reset transistor T2 222 is coupled to reset shared floating diffusion region 229. Select transistor T4 226 is coupled to transfer an amplified image signal from amplifier transistor T3 224 to readout column 212.

Figure 4:
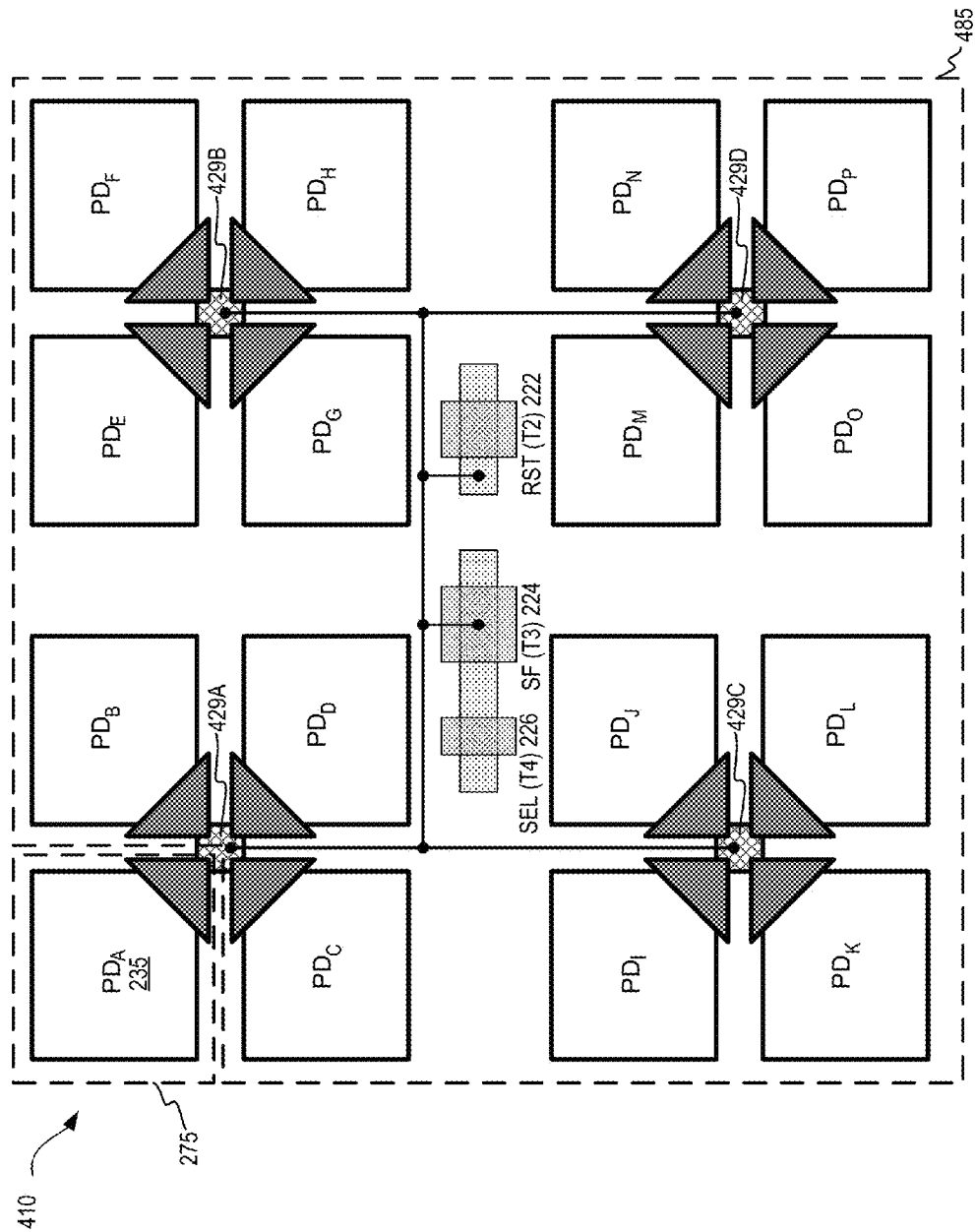
FIG. 4 is a plan view of one example of an image sensor pixel that includes a large sub-pixel and a small sub-pixel, in accordance with an embodiment of the disclosure.

FIG. 4 is a plan view of one example of an image sensor pixel 410 that includes a large sub-pixel 485 and small sub-pixel 275, in accordance with an embodiment of the disclosure. The plan view illustrated in FIG. 4 is one example layout of image sensor pixel 210. Image sensor pixel 410 includes fifteen photodiodes ($PD_B$-$PD_P$) in large sub-pixel 485. FIG. 4 shows that embodiments of this disclosure can include different numbers of photodiodes in the plurality of photodiodes that are included in large sub-pixel 285. In FIG. 3, three photodiodes are included in the plurality of photodiodes. In FIG. 4, fifteen photodiodes are included in the plurality of photodiodes. In different embodiments, the plurality of photodiodes may include two or more photodiodes.

In FIG. 4, the shaded triangles represent the transfer gates corresponding to their respective photodiodes, similar to FIG. 3. Although not illustrated, the transfer gates corresponding to the fifteen photodiodes in large sub-pixel 485 are coupled to receive a common transfer signal (e.g. $TX_L$ 241) to transfer the distributed image charge from the fifteen photodiodes, while the transfer gate corresponding to first photodiode $PD_A$ 235 is coupled to receive transfer signal (e.g. $TX_S$ 231) to transfer the first image charge from the first photodiode 235. Shared floating diffusion region 429A is wired (via a trace) to the gate terminal of amplifier transistor T3 224, which may be coupled as a source follower ("SF"). The gate terminal of amplifier transistor T3 224 is also coupled to shared floating diffusion regions 429B, 429C, and 429D, in FIG. 4. Since shared floating diffusion regions 429A, 429B, 429C, and 429D are physically wired together, they may be referred to as a local floating diffusion regions that are electrically coupled together to form a combined shared floating diffusion region. Reset transistor T2 222 is coupled to reset shared floating diffusion regions 429A, 429B, 429C, and 429D. Select transistor T4 226 is coupled to transfer an amplified image signal from amplifier transistor T3 224 to readout column 212. In FIG. 4, layout space is saved having only three transistors (222, 224, and 226) serving to transfer the image signal to the readout column 212.

Figure 5:
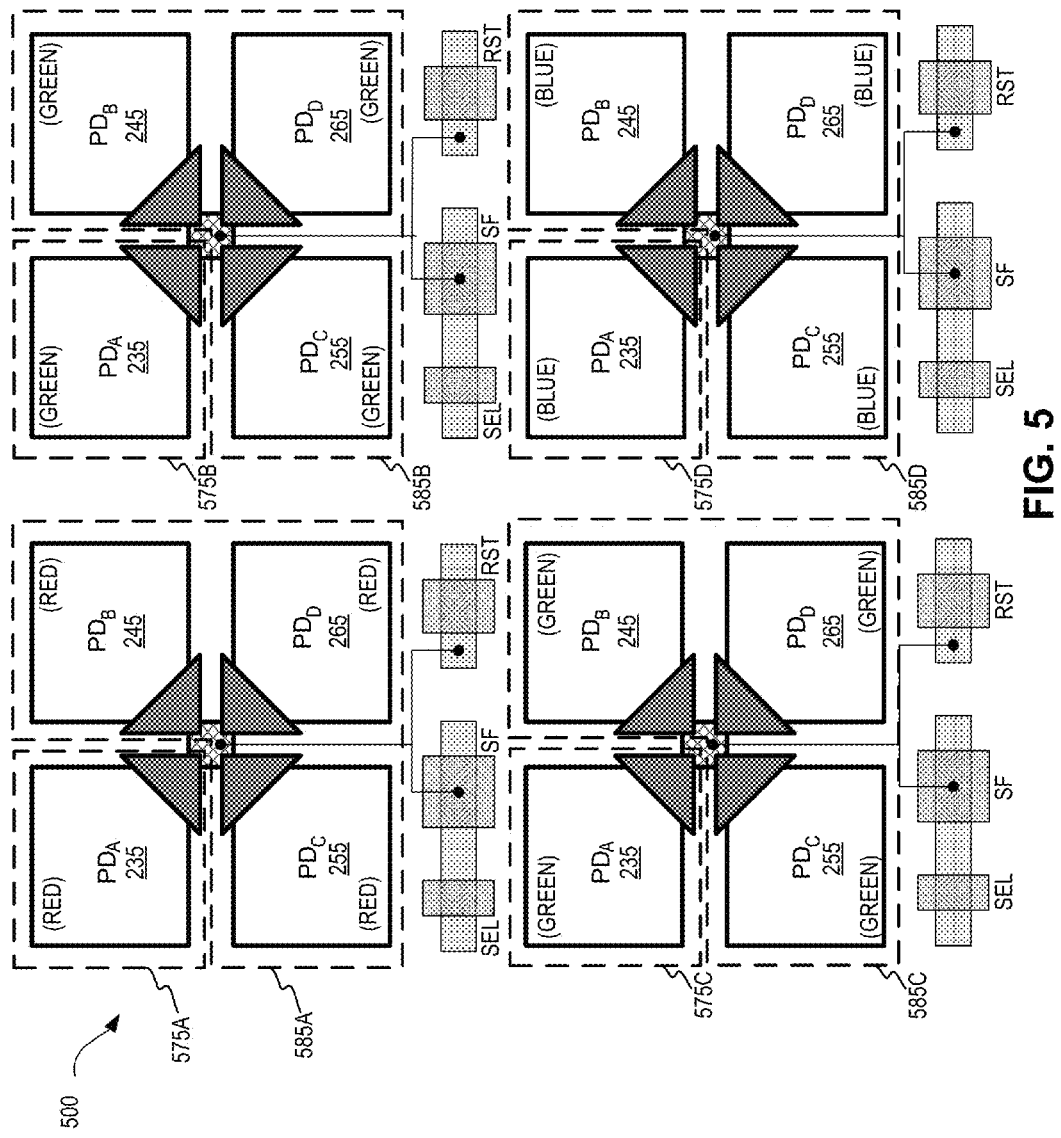
FIG. 5 is a plan view of one example of a pixel group that includes image sensor pixels that include a large sub-pixel and a small sub-pixel, in accordance with an embodiment of the disclosure.

FIG. 5 is a plan view of one example of a pixel group 500 that includes image sensor pixels 310 that include large sub-pixels 585 and small sub-pixels 575, in accordance with an embodiment of the disclosure. Pixel group 500 includes four image sensor pixels 310 (as illustrated in FIG. 3) arranged in a Red, Green, Green, Blue ("RGGB") Bayer pattern.

In FIG. 5, small sub-pixel 575A includes first photodiode $PD_A$ which is disposed under a red filter that passes red light but that substantially filters out other wavelengths of light from becoming incident on photodiode $PD_A$. Large sub-pixel 585A includes photodiodes $PD_B$-$PD_D$ which are also disposed under a red filter that passes red light but that substantially filters out other wavelengths of light from becoming incident on photodiodes $PD_B$-$PD_D$. Similarly, small sub-pixel 575B and 575C along with large sub-pixels 585B and 585C are disposed under green filters, while small sub-pixel 575D and large sub-pixel 585D are disposed under blue filters, forming a Bayer pattern. Pixel group 500 may be repeated to form an HDR RGGB image sensor, in accordance with embodiments of the disclosure.

In the disclosed embodiments of this disclosure it is appreciated that the first photodiode $PD_A$ and the plurality of photodiodes $PD_B$-$PD_\omega$ are included in an HDR image sensor that is capable of capturing an HDR image in a single frame. In other words, the first photodiode $PD_A$ and the plurality of photodiodes $PD_B$-$PD_\omega$ are able to accumulate image charge in overlapping time periods. First photodiode $PD_A$ may be designed to capture bright light image data while the plurality of photodiodes $PD_B$-$PD_\omega$ are designed to capture low light image data. The first image charge from first photodiode $PD_A$ is read out separately from the distributed image charge from the plurality of photodiodes $PD_B$-$PD_\omega$ to generate a bright light signal. The distributed image charge from the plurality of photodiodes $PD_B$-$PD_{107}$ is read out separately from the first image charge to generate a low light signal. The bright light signal and the low light signal can be utilized by HDR algorithms to generate an HDR image.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor pixel for use in a high dynamic range image sensor, the image sensor pixel comprising:
   a first photodiode disposed in a semiconductor material, wherein the first photodiode has a first light exposure area and a first doping concentration;
   a plurality of photodiodes disposed in the semiconductor material, wherein each photodiode in the plurality of photodiodes has the first light exposure area and the first doping concentration;
   a shared floating diffusion region;
   a first transfer gate coupled to transfer first image charge from the first photodiode to the shared floating diffusion region in response to a first transfer signal; and
   a second transfer gate coupled to simultaneously transfer distributed image charge from each photodiode in the plurality of photodiodes to the shared floating diffusion region in response to a common transfer signal that is distinct from the first transfer signal.

2. The image sensor pixel of claim 1, wherein the second transfer gate includes sub-gates coupled between the shared floating diffusion region and each photodiode in the plurality of photodiodes, wherein each of the sub-gates is electrically connected to receive the common transfer signal.

3. The image sensor pixel of claim 1, wherein the plurality of photodiodes and the first photodiode are evenly spaced in a symmetrical pattern.

4. The image sensor pixel of claim 3, wherein the plurality of photodiodes consists of three photodiodes.

5. The image sensor pixel of claim 3, wherein the plurality of photodiodes consists of fifteen photodiodes.

6. The image sensor pixel of claim 1 further comprising a reset transistor disposed in the semiconductor material and coupled to the shared floating diffusion region.

7. The image sensor pixel of claim 1 further comprising an amplifier transistor disposed in the semiconductor material, a gate of the amplifier transistor coupled to the shared floating diffusion region.

8. The image sensor pixel of claim 7 further comprising a select transistor disposed in the semiconductor material between the amplifier transistor and a readout column line.

9. The image sensor pixel of claim 1, wherein each photodiode in the plurality of photodiodes has a first charge capacity that is substantially equal to a second charge capacity of the first photodiode.

10. The image sensor pixel of claim 1, wherein the floating diffusion region includes a plurality of local floating diffusions electrically coupled together.

11. A high dynamic range imaging system comprising:
a pixel array having a plurality of image sensor pixels, wherein each one of the plurality of image sensor pixels includes:
a first photodiode disposed in a semiconductor material, wherein the first photodiode has a first light exposure area and a first doping concentration;
a plurality of photodiodes disposed in the semiconductor material, wherein each photodiode in the plurality of photodiodes has the first light exposure area and the first doping concentration;
a shared floating diffusion region;
a first transfer gate coupled to transfer first image charge from the first photodiode to the shared floating diffusion region in response to a first transfer signal; and
a second transfer gate coupled to simultaneously transfer distributed image charge from each photodiode in the plurality of photodiodes to the shared floating diffusion region in response to a common transfer signal that is distinct from the first transfer signal;
control circuitry coupled to the pixel array to control operation of the pixel array; and
readout circuitry coupled to the pixel array to readout image data from the plurality of image sensor pixels.

12. The imaging system of claim 11, wherein image sensor pixels in the plurality of image sensor pixels are included in a pixel group, wherein each respective image sensor pixel in the pixel group is disposed under a first filter that filters out a first target wavelength of image light propagating toward the respective image sensor pixels disposed under the first filter, the first filter being different than a second filter disposed over an adjacent image sensor pixel in the pixel group, wherein the second filter filters out a second target wavelength of image light different than the first target wavelength.

13. The imaging system of claim 12, wherein the first filter is a red filter, the second filter is a green filter, and the pixel group includes a blue filter disposed adjacent to the green filter.

14. The imaging system of claim 11, wherein the second transfer gate includes sub-gates coupled between the shared floating diffusion region and each photodiode in the plurality of photodiodes, wherein each of the sub-gates is electrically connected to receive the common transfer signal.

15. The imaging system of claim 11, wherein the plurality of photodiodes and the first photodiode are evenly spaced in a symmetrical pattern.

16. The imaging system of claim 11, wherein the plurality of photodiodes consists of three photodiodes.

17. The imaging system of claim 11, wherein the plurality of photodiodes consists of fifteen photodiodes.

18. The imaging system of claim 11, wherein each photodiode in the plurality of photodiodes has a first charge capacity that is substantially equal to a second charge capacity of the first photodiode.

19. The imaging system of claim 11, wherein the floating diffusion region includes a plurality of local floating diffusions electrically coupled together.

20. A high dynamic range imaging system comprising:
a pixel array having a plurality of image sensor pixels, wherein each one of the plurality of image sensor pixels includes:
a first photodiode disposed in a semiconductor material, wherein the first photodiode has a first light exposure area and a first doping concentration;
a plurality of photodiodes disposed in the semiconductor material, wherein each photodiode in the plurality of photodiodes has the first light exposure area and the first doping concentration;
a shared floating diffusion region;
a first transfer gate coupled to transfer first image charge from the first photodiode to the shared floating diffusion region; and
a second transfer gate coupled to transfer distributed image charge from each photodiode in the plurality of photodiodes to the shared floating diffusion region;
control circuitry coupled to the pixel array to control operation of the pixel array; and
readout circuitry coupled to the pixel array to readout image data from the plurality of image sensor pixels, wherein image sensor pixels in the plurality of image sensor pixels are included in a pixel group, wherein each respective image sensor pixel in the pixel group is disposed under a first filter that filters out a first target wavelength of image light propagating toward the respective image sensor pixels disposed under the first filter, the first filter being different than a second filter disposed over an adjacent image sensor pixel in the pixel group, wherein the second filter filters out a second target wavelength of image light different than the first target wavelength.

21. The imaging system of claim 20, wherein the first filter is a red filter, the second filter is a green filter, and the pixel group includes a blue filter disposed adjacent to the green filter.

* * * * *